United States Patent
Takase et al.

[19]

[11] Patent Number: 6,152,153
[45] Date of Patent: Nov. 28, 2000

[54] SUBSTRATE CLEANING/DRYING EQUIPMENT AND SUBSTRATE CLEANING/DRYING METHOD

[75] Inventors: Kazuhiko Takase; Yuji Fukazawa, both of Tokyo, Japan

[73] Assignee: Kabushiki Kaisha Toshiba, Kawasaki, Japan

[21] Appl. No.: 09/206,360

[22] Filed: Dec. 7, 1998

[30] Foreign Application Priority Data

Dec. 8, 1997 [JP] Japan ................................ 9-337413

[51] Int. Cl.[7] ........................................ B08B 3/10
[52] U.S. Cl. .................. 134/25.4; 134/95.2; 134/105; 134/902
[58] Field of Search ...................... 134/95.2, 105, 134/135, 137, 164, 902, 11, 25.4, 26; 34/77, 78

[56] References Cited

U.S. PATENT DOCUMENTS

| | | |
|---|---|---|
| Re. 35,879 | 8/1998 | Castelli et al. . |
| 3,742,904 | 7/1973 | Bishop . |
| 4,186,032 | 1/1980 | Ham . |
| 4,581,133 | 4/1986 | Tomes . |
| 5,443,540 | 8/1995 | Kamikawa ........................ 134/105 |
| 5,469,876 | 11/1995 | Gray et al. ........................ 134/105 |
| 5,520,744 | 5/1996 | Fujikawa et al. .................. 134/102.3 |
| 5,608,974 | 3/1997 | Tanaka et al. . |
| 5,934,299 | 8/1999 | Akatsu et al. .................... 134/105 |
| 6,001,191 | 12/1999 | Kamikawa et al. . |
| 6,050,275 | 8/1998 | Kamikawa et al. ............... 134/105 |

FOREIGN PATENT DOCUMENTS 2-291128  11/1990  Japan .

*Primary Examiner*—Frankie L. Stinson
*Attorney, Agent, or Firm*—Finnegan, Henderson, Farabow, Garrett & Dunner, L.L.P.

[57] ABSTRACT

There is provided a substrate cleaning/drying equipment for removing residual moisture from a substrate by exposing the substrate to an IPA steam after the substrate has been cleaned by a ultra pure water. The substrate cleaning/drying equipment comprises a cleaning/drying chamber for cleaning/drying the substrate, a cleaning tub which is provided below the cleaning/drying chamber and to which at least a ultra pure water is supplied, an IPA steam supplying pipe for supplying the IPA steam to an upper area of the cleaning/drying chamber such that the upper area of the cleaning/drying chamber is filled with the IPA steam, a steam supplying pipe for supplying a steam between the ultra pure water in the cleaning tub and the IPA steam, and a carrying unit for carrying the substrate, which has been cleaned by the ultra pure water, from the ultra pure water into the IPA steam via the steam. The ultra pure water, the steam, the IPA steam may be supplied onto the substrate by using injection nozzles respectively in order of the ultra pure water, the steam, the IPA steam.

13 Claims, 10 Drawing Sheets

SUBSTRATE CLEANING/DRYING EQUIPMENT AND SUBSTRATE CLEANING/DRYING METHOD

BACKGROUND OF THE INVENTION

1. Field of the Invention

The present invention relates to an equipment and a method for cleaning and drying a substrate. More particularly, the present invention relates to an equipment and a method for cleaning and drying various substrates such as a semiconductor substrate in semiconductor device manufacturing steps, a reticle (photomask) in a lithography step as one of the semiconductor device manufacturing steps, a flat panel in liquid crystal display manufacturing steps, etc.

2. Description of the Related Art

In order to clean the surface of the semiconductor substrate on which semiconductor devices are formed, etc., the cleaning step of the semiconductor substrate and the drying step following to the cleaning step are frequently repeated in the semiconductor device manufacturing steps. Especially, in order to form a silicon oxide film of high quality, it is essential to implement a ultra clean surface on the surface of the semiconductor substrate. Therefore, an oxide film on the surface of the semiconductor substrate is removed before the oxidizing step so as to expose the ultra clean surface.

Normally, the method of etching the surface of the semiconductor substrate by using a hydrogen fluoride group acid has been widely used as the method of removing the oxide film. An important matter in this hydrogen fluoride process is how to remove the moisture stuck on the semiconductor substrate when the semiconductor substrate is dried after cleaning. Usually, as the drying method after cleaning, the spin drying such as spin dryer, rinser dryer, etc. has been employed. In the spin drying, the semiconductor substrate is dried by rotating the semiconductor substrate at a high speed to blow off the moisture on the surface by the centrifugal force. However, if the spin drying is employed after the hydrogen fluoride process, often spot-like foreign matters, each of which is called a water mark, are generated on the surface of the semiconductor substrate. It has been known that such water mark is a stain caused by a waterdrop, which remains or is stuck onto the semiconductor substrate being cleaned/dried, and is formed of silica group material. This water mark acts as a mask in the etching process performed after the water mark has been generated, and thus makes it difficult to control the etching process. In addition, since the silica group material is formed of insulative silicon dioxide, it causes defects of conduction of the contact portion if it generates on the contact portions.

In recent years, in order to prevent generation of the water mark, the steam drying using 2-propanol or isopropyl alcohol (abbreviated as "IPA" hereinafter) is being employed. According this method, the moisture on the semiconductor substrate is replaced with the IPA steam by exposing the semiconductor substrate to the IPA steam, and then drying of the semiconductor substrate is conducted by evaporating naturally the replaced IPA. In the prior art, as the cleaning/drying equipment employing this steam drying, for example, followings are listed.

FIG. 1 is a schematic view showing an example of a configuration of a substrate cleaning/drying equipment using the steam drying. As shown in FIG. 1, the substrate cleaning/drying equipment comprises a cleaning chamber 5, and a drying chamber 13. The cleaning chamber 5 may be composed of a single chamber which can switch various chemicals such as hydrogen fluoride, etc. and the ultra pure water continuously, or composed of a plurality of chemicals chambers and a rinsing chamber. An IPA temperature adjusting tub 7 in which the IPA is filled, and a heater 9 for heating the IPA temperature adjusting tub 7 to boil the IPA in the IPA temperature adjusting tub 7 are provided in the drying chamber 13. The IPA steam 11 is filled in an upper area of the drying chamber 13.

An operation of the substrate cleaning/drying equipment shown in FIG. 1 is given as follows. To begin with, a cassette 3 on which a plurality sheets of semiconductor substrates 1 are loaded is immersed into the cleaning chamber 5 to effect the cleaning by using various chemicals and the ultra pure water. Then, a predetermined carrying means carries the cassette 3 into the drying chamber 13 after the cleaning. Then, the semiconductor substrates 1 in the cassette 3 are left in the IPA steam 11, then the moisture stuck on the semiconductor substrates 1 is replaced with the IPA steam, and then the semiconductor substrates 1 are dried by naturally evaporating the replaced IPA. In this manner, according to the substrate cleaning/drying equipment using the IPA steam drying shown in FIG. 1, the moisture on the semiconductor substrates 1 can be removed completely, so that generation of the water mark can be prevented.

As described above, in the substrate cleaning/drying equipment shown in FIG. 1, since the cleaning chamber 5 and the drying chamber 13 are provided separately, transfer of the semiconductor substrates 1 from the cleaning chamber 5 to the drying chamber 13 is needed after the cleaning has been terminated. In this transfer, the semiconductor substrates 1 are exposed to the outer air, but natural drying of the semiconductor substrates 1 will occur during transfer according to transfer velocity, transfer distance, etc. This natural drying causes the water marks on the surface of the semiconductor substrates 1. In contrast, the IPA steam is generated by boiling directly the IPA in the drying chamber 13. Therefore, a great deal of IPA must be consumed and also an enough safety countermeasure against the flammability of the IPA must be taken.

As the substrate cleaning/drying equipment which can avoid the above problem, for example, the following has been proposed. FIG. 2 is a schematic view showing another example of a configuration of a substrate cleaning/drying equipment using a steam drying. This substrate cleaning/drying equipment is constructed such that cleaning and drying of the semiconductor substrates are carried out in the same chamber. As shown in FIG. 2, this substrate cleaning/drying equipment has a cleaning/drying chamber 15 in which both cleaning and drying of the semiconductor substrates 1 are executed. The cleaning/drying chamber 15 has a cleaning tub 17 at its bottom. The cleaning tub 17 may be composed of a single processing tub which can switch various chemicals such as hydrogen fluoride, etc. and the ultra pure water continuously, or composed of a plurality of chemicals tubs and a rinsing tub. The IPA steam 11 is filled in an upper area of the cleaning/drying chamber 15. The IPA steam 11 is generated in an IPA temperature adjusting tub 21 which is arranged on the outside of the cleaning/drying chamber 15. Then, a carrier gas such as $N_2$, Ar, etc. acting as the temperature adjusting gas is introduced into the IPA temperature adjusting tub 21. The IPA steam 11 in concert with the carrier gas is introduced from the IPA temperature adjusting tub 21 into the cleaning/drying chamber 15 via the IPA steam pipe 19.

An operation of the substrate cleaning/drying equipment shown in FIG. 2 is given as follows. At first, the cassette 3 on which a plurality sheets of semiconductor substrates 1 are loaded is immersed into the cleaning tub 17 to execute the cleaning by using various chemicals and the ultra pure water. Then, after the cleaning has been finished, the IPA steam 11 is introduced into the cleaning/drying chamber 15 such that an upper area of the cleaning/drying chamber 15 is filled with the IPA steam 11. Then, the IPA steam 11 spreads on the surface of the ultra pure water in the cleaning tub 17 to form an IPA condensed layer. Thereafter, the semiconductor substrates 1 is pulled up gradually from the ultra pure water into the IPA steam 11. At that time, the ultra pure water stuck on the semiconductor substrates 1 is replaced with the condensed IPA, and then the semiconductor substrates 1 are dried by naturally evaporating the replaced IPA. In this manner, the cleaning and drying of the semiconductor substrates 1 can carried out in the same chamber in the substrate cleaning/drying equipment shown in FIG. 2. That is to say, transfer of the semiconductor substrates 1 from the cleaning step to the drying step in the outer air can be omitted. Accordingly, unlike the equipment in FIG. 1, natural drying of the semiconductor substrates 1 during transfer does not occur and thus no water mark is generated. Further, in the substrate cleaning/drying equipment in FIG. 2, since the IPA steam 11 is introduced into the cleaning/drying chamber 15 only at the time of drying the semiconductor substrates 1, consumption of the IPA can be suppressed inevitably. Furthermore, since the IPA is not heated in the cleaning/drying chamber 15, the safety against flammability of the IPA can be assured sufficiently.

However, the substrate cleaning/drying equipment shown in FIG. 2 has a following disadvantage. FIG. 3 is a conceptional view showing the case where the semiconductor substrate 1 showing in FIG. 2 is pulled up from the ultra pure water 23 in the cleaning tub 17 into the IPA steam 11. As shown in FIG. 3, silica group material 25, which is stuck on the semiconductor substrate 1 after the hydrogen fluoride process, can be removed from the semiconductor substrate 1 because of difference in the surface tension acting to the ultra pure water 23 and the IPA condensed layer when the semiconductor substrate 1 is pulled up from the ultra pure water 23 in the IPA steam 11. In the meanwhile, the batch process in which a plurality of semiconductor substrates are processed at once is commonly employed in the existing cleaning step. The semiconductor substrates 1 are arranged so as to oppose their front surfaces to their back surfaces mutually. Accordingly, there is a possibility that silica group material 25 being removed once moves on the surface of the ultra pure water 23 and then sticks onto the surface of the opposing semiconductor substrate 1 again. In particular, an oxide film formed in various steps still remains on the back surface of the semiconductor substrate 1, so that the oxide film is subjected to the hydrogen fluoride process to thus generate the silica group material 25. Therefore, such silica group material 25 may be stuck once again on the surface of the semiconductor substrate 1, i.e., the surface on which the semiconductor devices are formed, to thus cause particles. In addition, if both the oxide film and the silicon are exposed on the surface of the semiconductor substrate 1, re-sticking of the silica group material 25 becomes remarkable owing to difference in wettability of the oxide film and the silicon.

Moreover, with the higher integration density and higher density of the recent semiconductor devices, unevenness on the semiconductor substrate 1 tends to be enhanced extremely. As a result, re-sticking of the silica group material as shown in FIG. 3 an be similarly caused between such unevennesses.

SUMMARY OF THE INVENTION

The present invention has been made in light of the above circumstances, and it is an object of the present invention to provide a substrate cleaning/drying equipment and method capable of suppressing generation of water marks. More particularly, it is an object of the present invention to provide a substrate cleaning/drying equipment and method capable of preventing silica group material, which is removed from the substrate once, from being absorbed onto the substrate again to thereby reduce particles.

In order to achieve the above object, according to a first aspect of the present invention, there is provided a substrate cleaning/drying equipment for removing moisture from a cleaned substrate by exposing the substrate to a dry steam, comprising a cleaning/drying chamber for cleaning/drying the substrate; a cleaning tub provided below the cleaning/drying chamber, at least a ultra pure water being supplied to the cleaning tub; a dry steam supplying means for supplying the dry steam to an upper area of the cleaning/drying chamber; a steam supplying means for supplying a steam between the ultra pure water in the cleaning tub and the dry steam; and a carrying means for carrying the substrate from the ultra pure water into the dry steam via the steam.

The first aspect of the present invention relates to the batch type substrate cleaning/drying equipment in which a plurality of substrates are cleaned/dried at once. In the first aspect of the present invention, cleaning of the substrate can be effected by using various chemicals and the ultra pure water in the cleaning tub arranged in the cleaning/drying chamber. Then, after the cleaning using the ultra pure water has been finished, the substrate can be pulled up from the ultra pure water and then left in the dry steam. The moisture being stuck on the substrate can be replaced with the dry steam by exposing the substrate to the dry steam, and then the replaced dry steam is naturally evaporated. Therefore, the substrate is dried. Especially, in the first aspect of the present invention, the substrate is not pulled up directly from the ultra pure water into the dry steam, but the substrate is transferred from the ultra pure water into the dry steam via the steam. Accordingly, when the semiconductor substrate is pulled up from the steam into the dry steam, silica group material being removed from the semiconductor substrate drops down because of its own weight. As a result, such a problem can be avoided that the removed silica group material moves on the ultra pure water and is then stuck on other semiconductor substrate again.

In order to achieve the above object, according to a second aspect of the present invention, there is provided a substrate cleaning/drying equipment for removing moisture from a cleaned substrate by exposing the substrate to a dry steam, comprising a cleaning liquid injecting means for injecting at least a ultra pure water onto the substrate; a steam injecting means for injecting a steam onto the substrate; a dry steam injecting means for injecting a dry steam onto the substrate; and a substrate arranging means for exposing the substrate to the ultra pure water, the steam, and the dry steam in order of the ultra pure water, the steam, and the dry steam.

The second aspect of the present invention relates to the sheet-fed type substrate cleaning/drying equipment. In the second aspect of the present invention, the same advantages as the first aspect of the present invention can be achieved by injecting the ultra pure water, the steam, the dry steam in this order onto the substrate which has been subjected to the cleaning step respectively.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1:
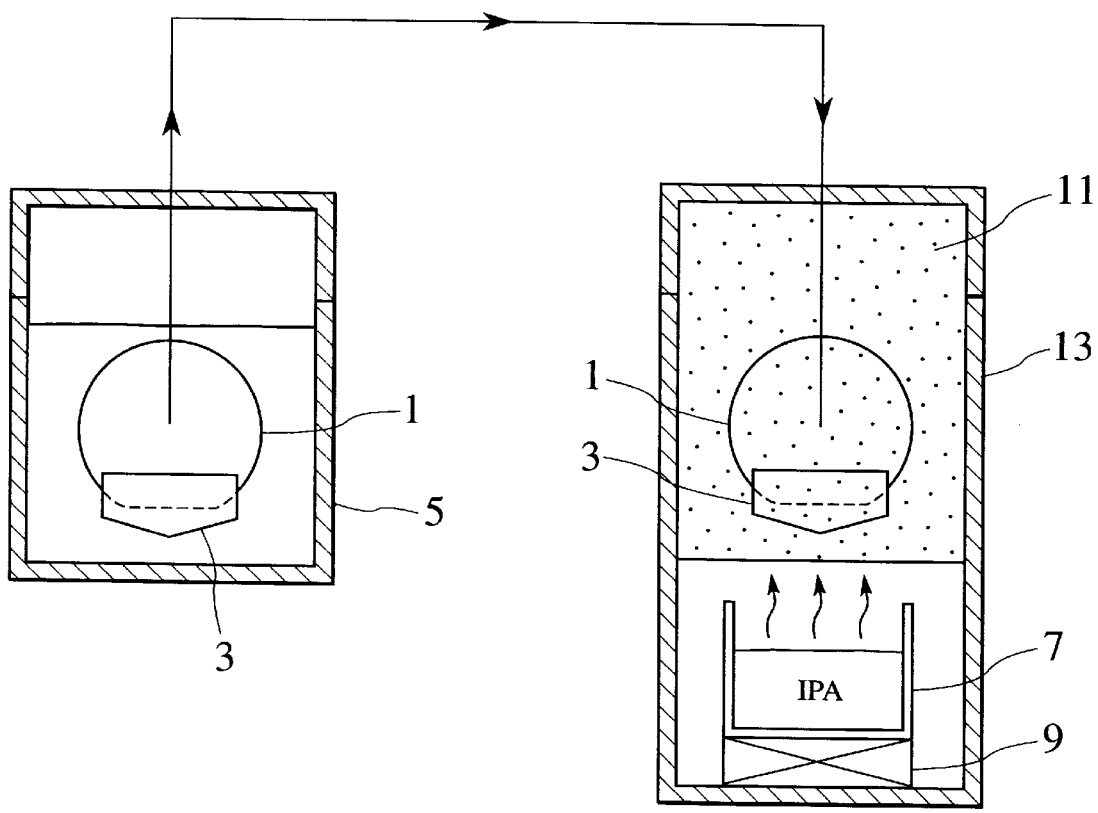
FIG. 1 is a schematic view showing an example of a configuration of a substrate cleaning/drying equipment using a steam drying.

Various embodiments of the present invention will be described with reference to the accompanying drawings. It is to be noted that the same or similar reference numerals are applied to the same or similar parts and elements throughout the drawings, and the description of the same or similar parts or elements will be omitted or simplified.

FIRST EMBODIMENT

Figure 4:
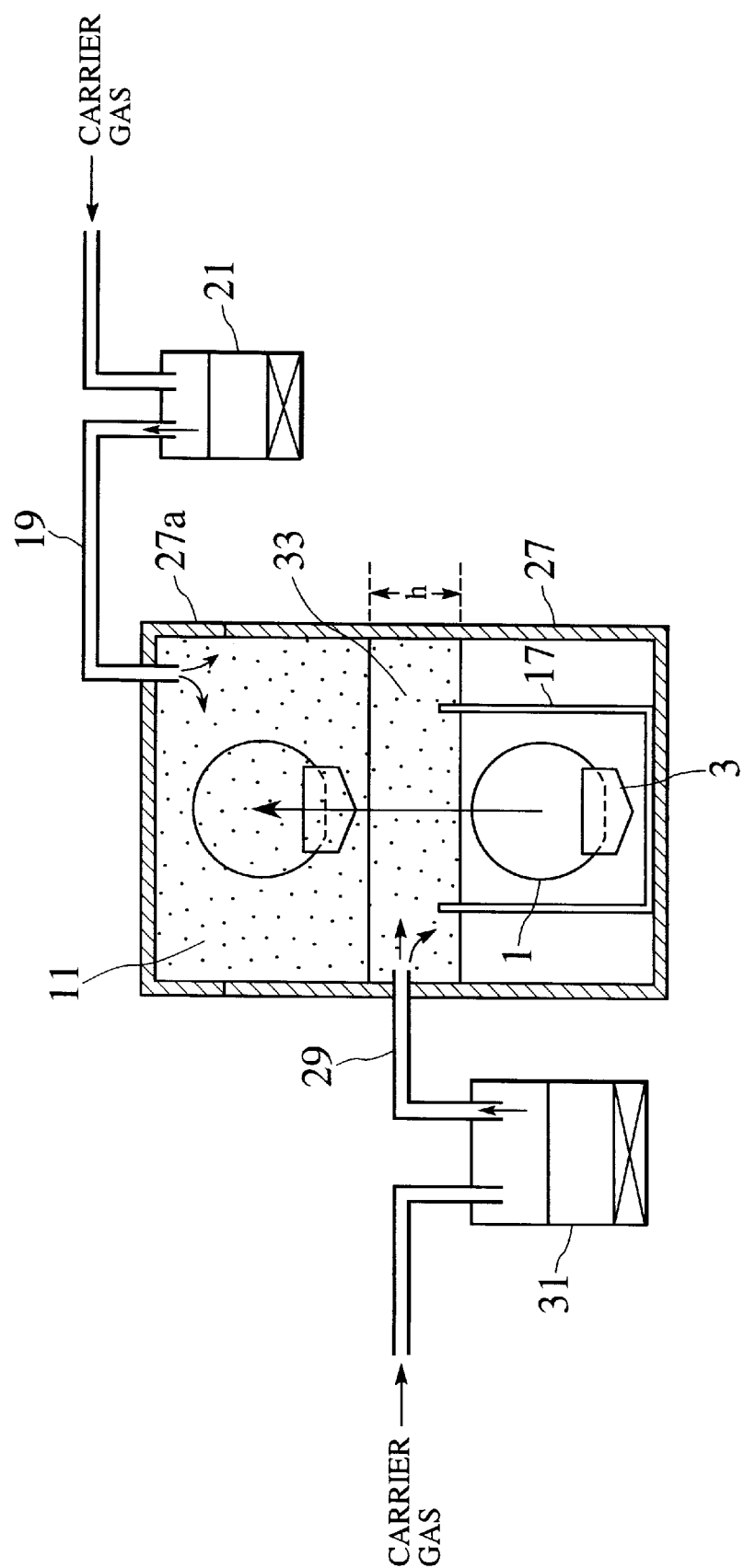
FIG. 4 is a schematic view showing a configuration of a substrate cleaning/drying equipment according to a first embodiment of the present invention.
Figure 5:
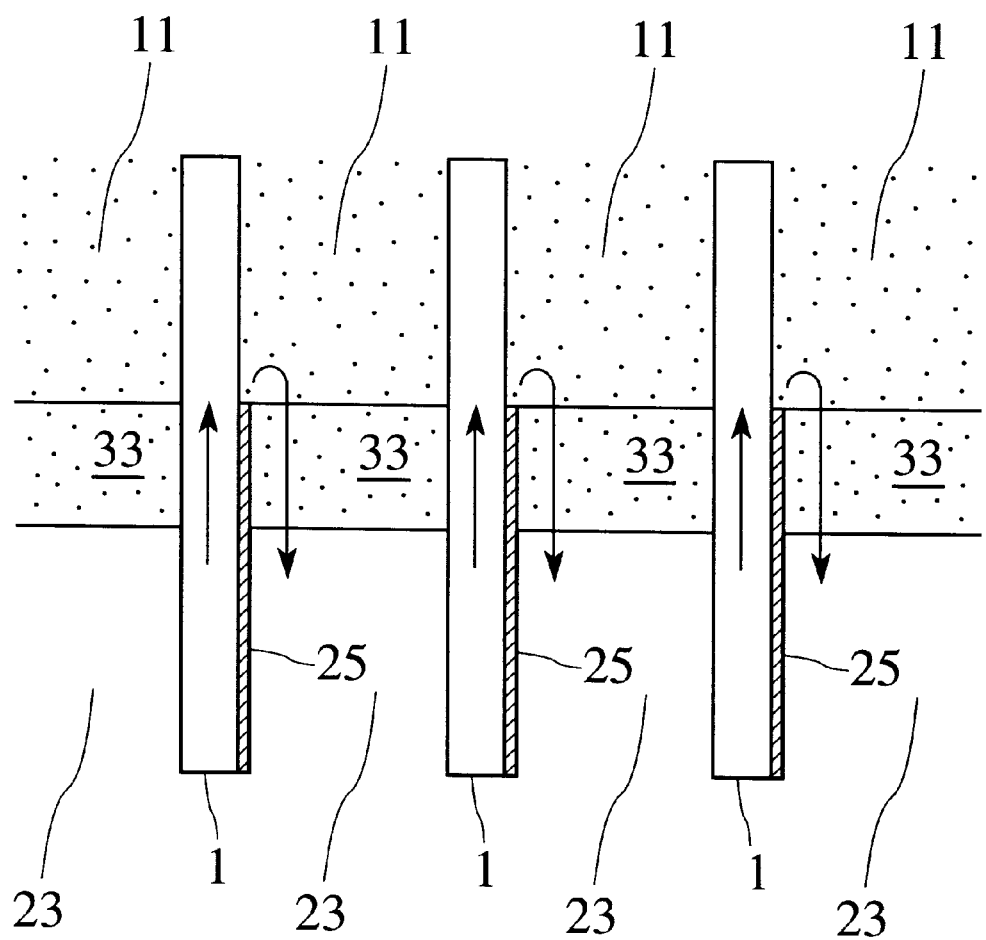
FIG. 5 is a conceptional view showing the case where a semiconductor substrate 1 showing in FIG. 4 is pulled up from a ultra pure water 23 in a cleaning tub 17 into an IPA steam 11 via a steam 33.
Figure 6:
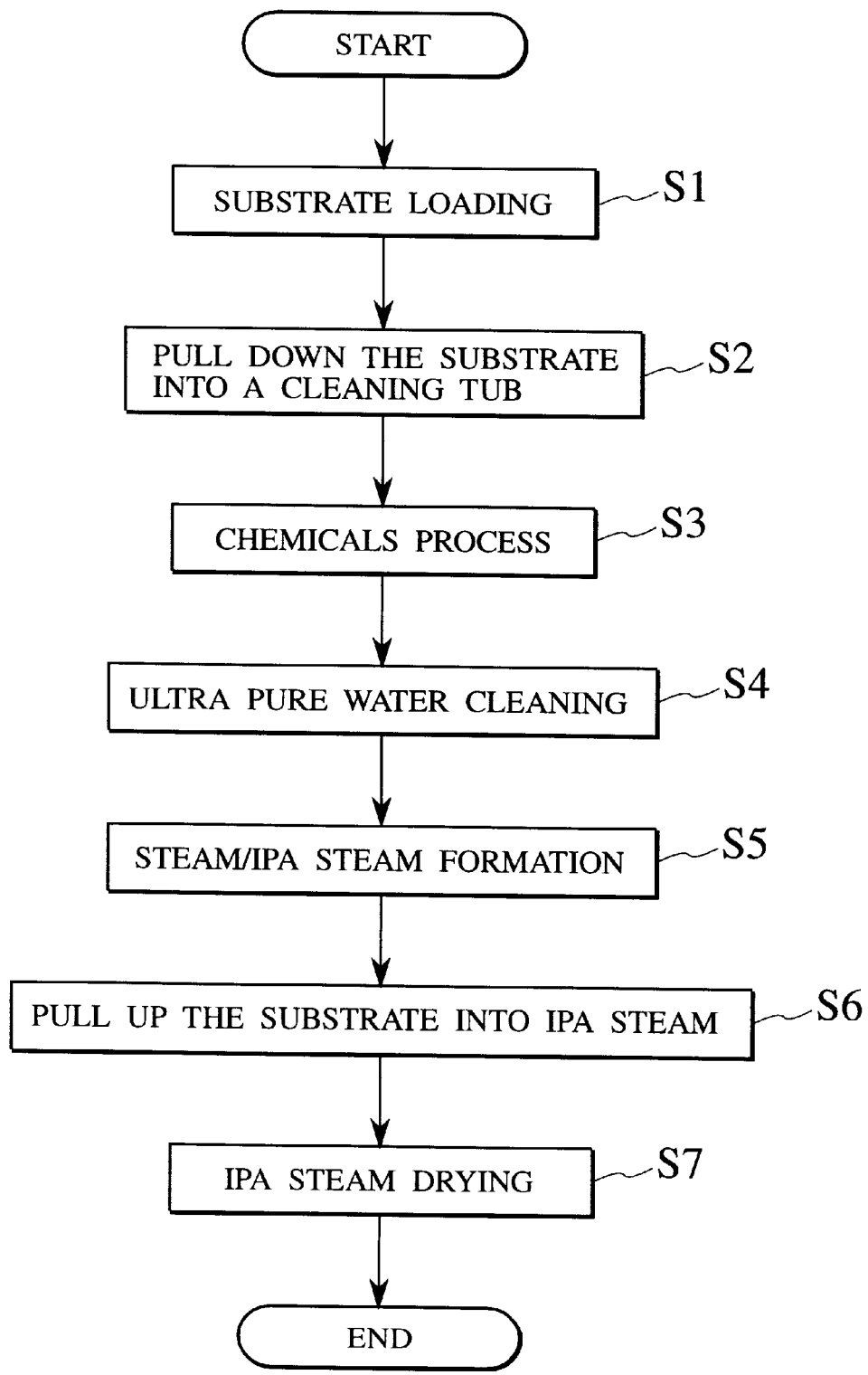
FIG. 6 is a flowchart showing process procedures of an operation of the substrate cleaning/drying equipment according to the first embodiment of the present invention.

A first embodiment of the present invention will be explained with reference to FIGS. 4 to 6 hereinbelow. FIG. 4 is a schematic view showing a configuration of a substrate cleaning/drying equipment according to the first embodiment of the present invention. The substrate cleaning/drying equipment according to the first embodiment of the present invention executes cleaning and drying of the semiconductor substrate in the same chamber. As shown in FIG. 4, this substrate cleaning/drying equipment comprises a cleaning/drying chamber 27 in which both cleaning and drying of the semiconductor substrate 1 can be carried out. The cleaning/drying chamber 27 has a lid 27a which can be opened and closed arbitrarily on its top portion. This lid 27a is opened when the semiconductor substrate 1 is loaded into the cleaning/drying chamber 27 or the semiconductor substrate 1 is unloaded from the cleaning/drying chamber 27, and is closed to bring the cleaning/drying chamber 27 into sealing condition when the cleaning or drying process of the semiconductor substrate 1 is conducted.

The cleaning/drying chamber 27 has a cleaning tub 17 at its bottom portion. The cleaning tub 17 may be composed of a single processing tub which can switch various chemicals such as hydrogen fluoride and a ultra pure water continuously, or composed of a plurality of chemicals tubs and a water cleaning tub. An introducing pipe for introducing the chemicals, the ultra pure water, etc. into the cleaning tub 17 is provided to the cleaning tub 17. A bottom portion of the cleaning tub 17 can be selected, for example, as an installing location of the introducing pipe. The cleaning tub 17 receives the chemicals and the ultra pure water from a chemicals supply source and a ultra pure water supply source arranged respectively on the outside of the cleaning/drying chamber 27 via the introducing pipe. The cleaning tub 17 has functions of adjusting chemicals temperature, exchanging automatically the chemicals, filtering the chemicals and the ultra pure water, etc.

The cleaning/drying chamber 27 has an IPA steam pipe 19 on its top portion. The IPA steam pipe 19 is connected to an IPA steam supply source provided on the outside of the cleaning/drying chamber 27. The cleaning/drying chamber 27 receives an IPA steam 11 from the IPA steam supply source via the pipe 19 to introduce the IPA steam 11 into its inside. The IPA steam pipe 19 introduces the IPA steam 11 into the cleaning/drying chamber 27 while adjusting a flow rate and a flow velocity such that an upper area of the cleaning/drying chamber 27 is filled with the IPA steam 11. Although various configurations may be adopted as the IPA steam supply source, an IPA temperature adjusting tub 21 in which a carrier gas such as $N_2$, Ar, etc. acting as a temperature adjusting gas is introduced may be employed, for example, as shown in FIG. 4. In the case of the IPA temperature adjusting tub 21, the IPA steam 11 generated in the IPA temperature adjusting tub 21 may be introduced into the cleaning/drying chamber 27 via the IPA steam pipe 19. Then, temperature control of the IPA steam 11 is executed by the carrier gas.

In addition, the cleaning/drying chamber 27 has a steam pipe 29. The steam pipe 29 is provided on the side surface of the cleaning/drying chamber 27. A fitting height of the steam pipe 29 is set between a position at which the cleaning process of the semiconductor substrate 1 is executed and a position at which the drying process of the semiconductor substrate 1 is executed. In other words, the fitting location of the steam pipe 29 is decided such that a steam 33 can be introduced between a bottom surface of the IPA steam 11, which is filled in the upper area of the cleaning/drying chamber 27, and a top surface of the ultra pure water in the cleaning tub 17. The steam pipe 29 is connected to a steam supply source provided on the outside of the cleaning/drying chamber 27, and introduces the steam into the cleaning/drying chamber 27 while adjusting the flow rate and the flow velocity. The steam 33 being introduced can be filled between the bottom surface of the IPA steam, which is filled in the upper area of the cleaning/drying chamber 27, and a top surface of the ultra pure water in the cleaning tub 17. As the steam supply source, for example, there is a ultra pure water temperature adjusting tub 31 into which the carrier gas such as $N_2$, Ar, etc. is introduced. A temperature of the steam can be controlled according to an amount of introduced carrier gas.

Various parameters such as flow velocity, temperature, etc. of the IPA steam 11 and the steam 33 can be set such that the IPA steam 11 and the steam 33 can be formed separately in the cleaning/drying chamber 27. For example, the flow velocity of the steam 33 may be set higher than that of the IPA steam 11. More particularly, it is preferable that the flow velocity of the steam 33 should be set to 10 m/s or more and the flow velocity of the IPA steam 11 should be set lower than that of the steam 33. The temperature of the IPA steam 11 may be set higher than that of the steam 33. More particularly, it is preferable that the temperature of the steam 33 should be set to less than 50° C. and the temperature of the IPA steam 11 should be set to more than 50° C. Also, it is preferable that a width h of the steam 33 should be set to more than 5 mm and less than a diameter of the semiconductor substrate 1.

Figure 2:
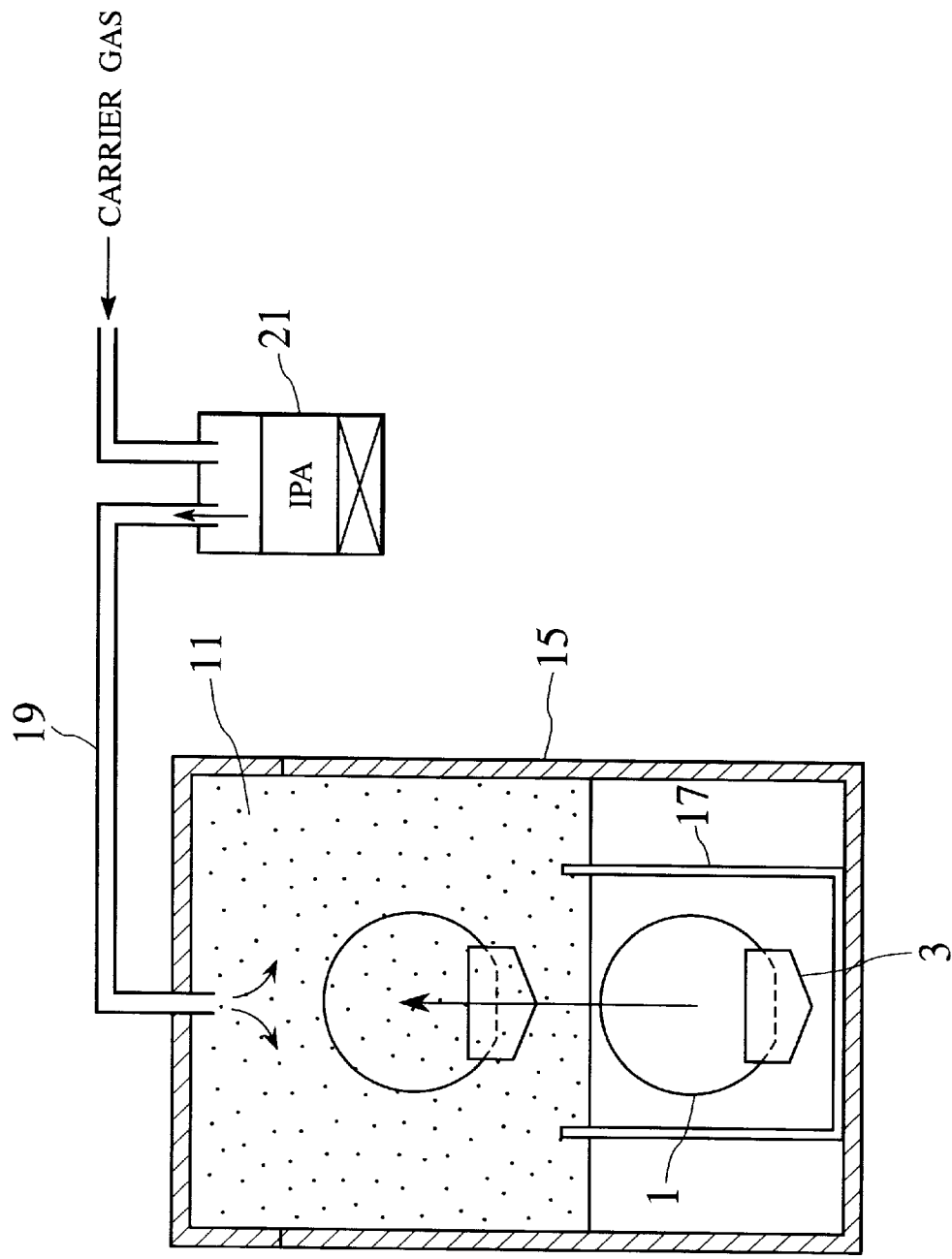
FIG. 2 is a schematic view showing another example of a configuration of a substrate cleaning/drying equipment using a steam drying.
Figure 3:
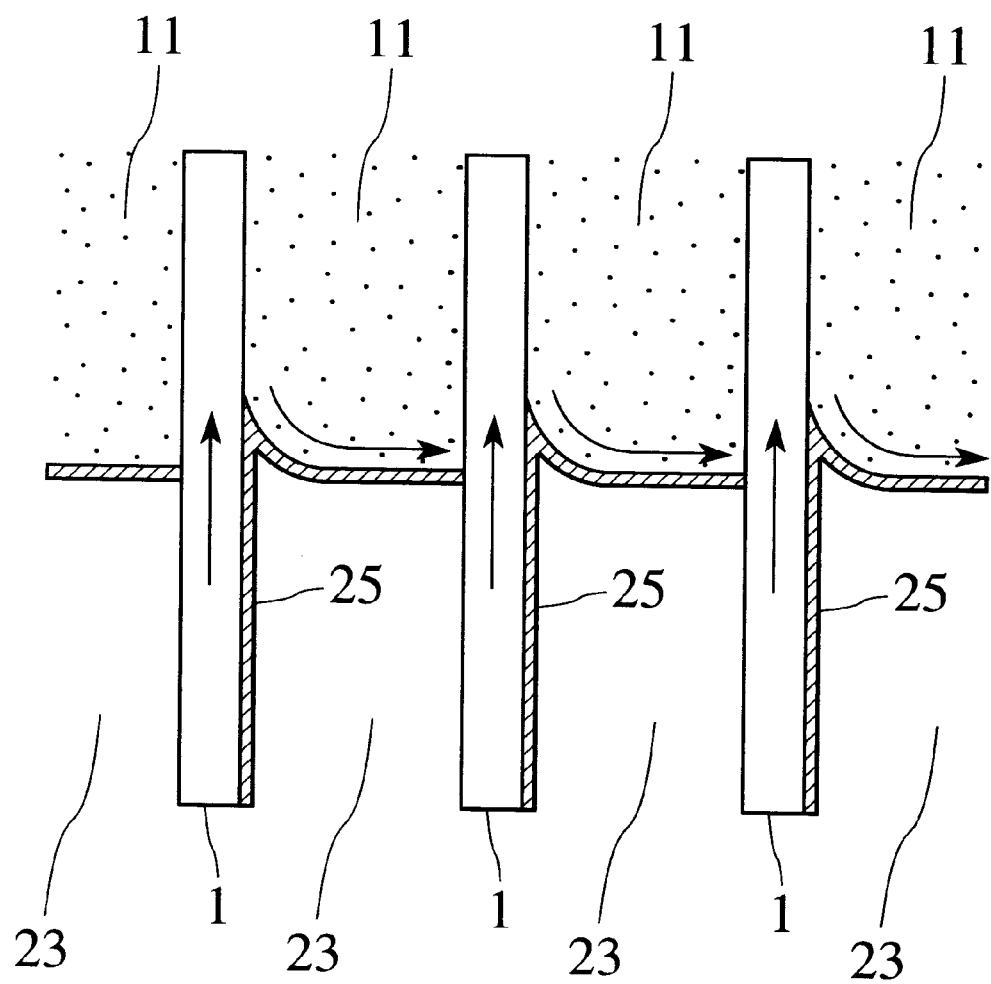
FIG. 3 is a conceptional view showing the case where a semiconductor substrate 1 showing in FIG. 2 is pulled up from a ultra pure water 23 in a cleaning tub 17 into an IPA steam 11.

Next, an function of the steam 33 in the cleaning/drying chamber 27 will be explained with reference to FIG. 5 hereinbelow. FIG. 5 is a conceptional view showing the case where the semiconductor substrate 1 showing in FIG. 4 is pulled up from the ultra pure water 23 in the cleaning tub 17 into the IPA steam 11 via the steam 33. In the equipment in FIG. 2, as shown in FIG. 3, there has been such a problem that silica group material 25 which has been removed once is moved on a surface of the ultra pure water 23 and then stuck onto the opposing semiconductor substrate 1 again. However, in the substrate cleaning/drying equipment according to the first embodiment of the present invention and shown in FIG. 4, as shown in FIG. 5, the steam 33 is provided between the IPA steam 11 and the ultra pure water 23 to prevent direct contact of the IPA steam 11 and the ultra pure water 23. Accordingly, when the semiconductor substrate 1 is pulled up from the steam 33 into the IPA steam 11, silica group material 25 being removed from the semiconductor substrate 1 in no way moves on a surface of the ultra pure water 23, but such silica group material 25 drops down because of its own weight. That is, such material is not stuck on other semiconductor substrate 1 again. Because of the presence of the steam 33, the semiconductor substrate 1 can be kept in its wet condition during when the semiconductor substrate 1 moves from the ultra pure water 23 into the IPA steam 11. As a result, natural drying of the semiconductor substrate 1 does not occur.

Next, an operation of the substrate cleaning/drying equipment according to the first embodiment of the present invention will be explained with reference to FIG. 6 hereinbelow. FIG. 6 is a flowchart showing process procedures of the operation of the substrate cleaning/drying equipment according to the first embodiment of the present invention. Here, the lid 27a of the cleaning/drying chamber 27 has already been opened. A driving unit which moves a cassette 3, in which the semiconductor substrates 1 are loaded, vertically in the cleaning/drying chamber 27 is in a standby state over the cleaning/drying chamber 27.

After predetermined semiconductor device manufacturing steps have been completed, a plurality of semiconductor substrates 1 which are loaded in the cassette 3 are carried into an upper area of the cleaning/drying chamber 27 by an operator in a clean room or a carrying robot. Then, the operator or the carrying robot loads the cassette 3 onto the driving unit. Thus, loading of the semiconductor substrate 1 into the cleaning/drying chamber 27 has been completed (step 1).

Then, the driving unit pulls down the semiconductor substrates 1 into the cleaning tub 17 (step 2).

Then, the lid 27a is closed so that the cleaning/drying chamber 27 is brought into its sealing condition. Then, various chemicals such as hydrogen fluoride, etc. are injected into the cleaning tub 17 via the introducing pipes, and then the chemicals process is applied to the semiconductor substrates 1. Types of employed chemicals are decided according to the object of cleaning. Normally, the chemicals process is repeated while changing the chemicals at plural timed (step 3).

Then, after the chemicals process has been finished, final cleaning by using the ultra pure water is performed. The ultra pure water is supplied to the cleaning tub 17 to carry out the over flow (step 4).

Then, the steam 33 and the IPA steam 11 are supplied sequentially from the steam pipe 29 and the IPA steam pipe 19 respectively. The steam 33 and the IPA steam 11 are filled in the cleaning/drying chamber 27 respectively (step 5).

Then, the semiconductor substrates 1 are pulled up from the ultra pure water in the cleaning tub 17 by the driving unit, then passed through the steam 33, and then displaced in the IPA steam 11. In this pulling-up operation, as described above, because of the presence of the steam 33, generation of water marks can be suppressed and also re-sticking of the silica group material can be prevented (step 6).

Next, the moisture on the semiconductor substrate 1 is replaced wit the IPA steam. Then, drying of the semiconductor substrates 1 can be accomplished after the replaced IPA steam has been naturally evaporated (step 7).

In this manner, in the substrate cleaning/drying equipment according to the first embodiment of the present invention, since direct contact of the ultra pure water 23 in the cleaning tub 17 and the IPA steam 11 can be prevented, the situation that the silica group material being removed once moves on the surface of the ultra pure water 23 to come up to other semiconductor substrate 1 can be avoided. Accordingly, the situation that the silica group material being removed from the semiconductor substrates 1 is stuck onto other semiconductor substrates 1 once again when the semiconductor substrates 1 are pulled up from the ultra pure water 23 can be prevented. Since the steam 33 exists between the ultra pure water 23 in the cleaning tub 17 and the IPA steam 11, natural drying of the semiconductor substrates 1 caused in moving between the ultra pure water 23 and the IPA steam can be prevented. As a result, no water mark is generated when the semiconductor substrates 1 is carried from the ultra pure water 23 to the IPA steam 11.

SECOND EMBODIMENT

Figure 7:
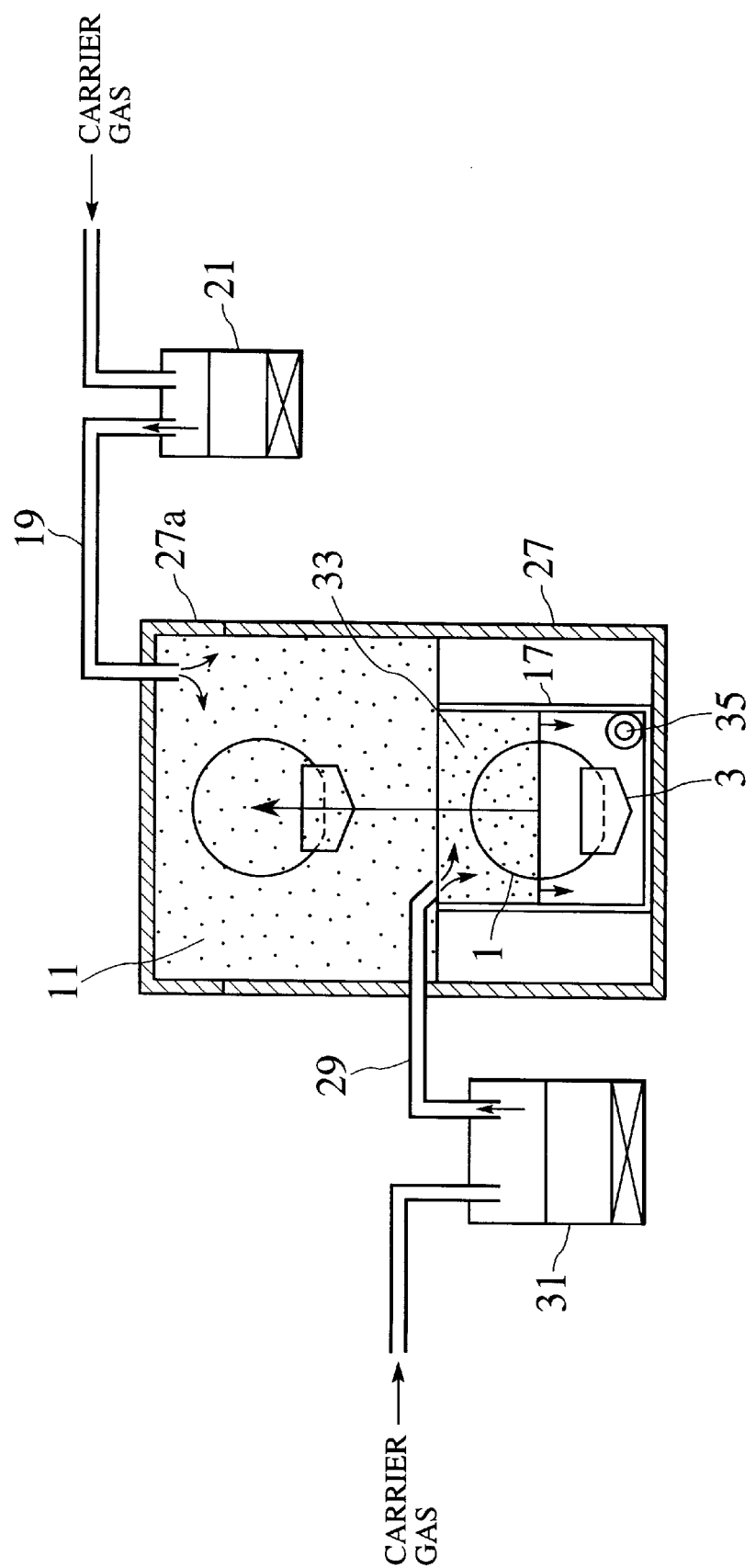
FIG. 7 is a schematic view showing a configuration of a substrate cleaning/drying equipment according to a second embodiment of the present invention.

Next, a second embodiment of the present invention will be explained hereinbelow. FIG. 7 is a schematic view showing a configuration of a substrate cleaning/drying equipment according to the second embodiment of the present invention. In the first embodiment shown in FIG. 4, the steam 33 is formed between the ultra pure water 23 in the cleaning tub 17 and the IPA steam 11. In contrast, in this second embodiment of the present invention, when the ultra pure water 23 is discharged via a discharge pipe 35 after the cleaning by using the ultra pure water has been finished, the steam 33 is introduced into the cleaning tub 17 via the steam pipe 29 to mate with a discharge velocity until such steam 33 is filled in the cleaning tub 17. That is, the semiconductor substrates 1 can be passed through the steam 33 having a sufficient width. Unless the width of the steam 33 between the ultra pure water 23 and the IPA steam 11 is sufficient, there is a possibility that movement of the silica group material shown in FIG. 3 on the surface of the ultra pure water 23 cannot be perfectly prevented. As a result, the substrate cleaning/drying equipment according to the second embodiment of the present invention shown in FIG. 7 can prevent movement of the silica group material more firmly than the substrate cleaning/drying equipment shown in FIG. 4.

THIRD EMBODIMENT

Figure 8:
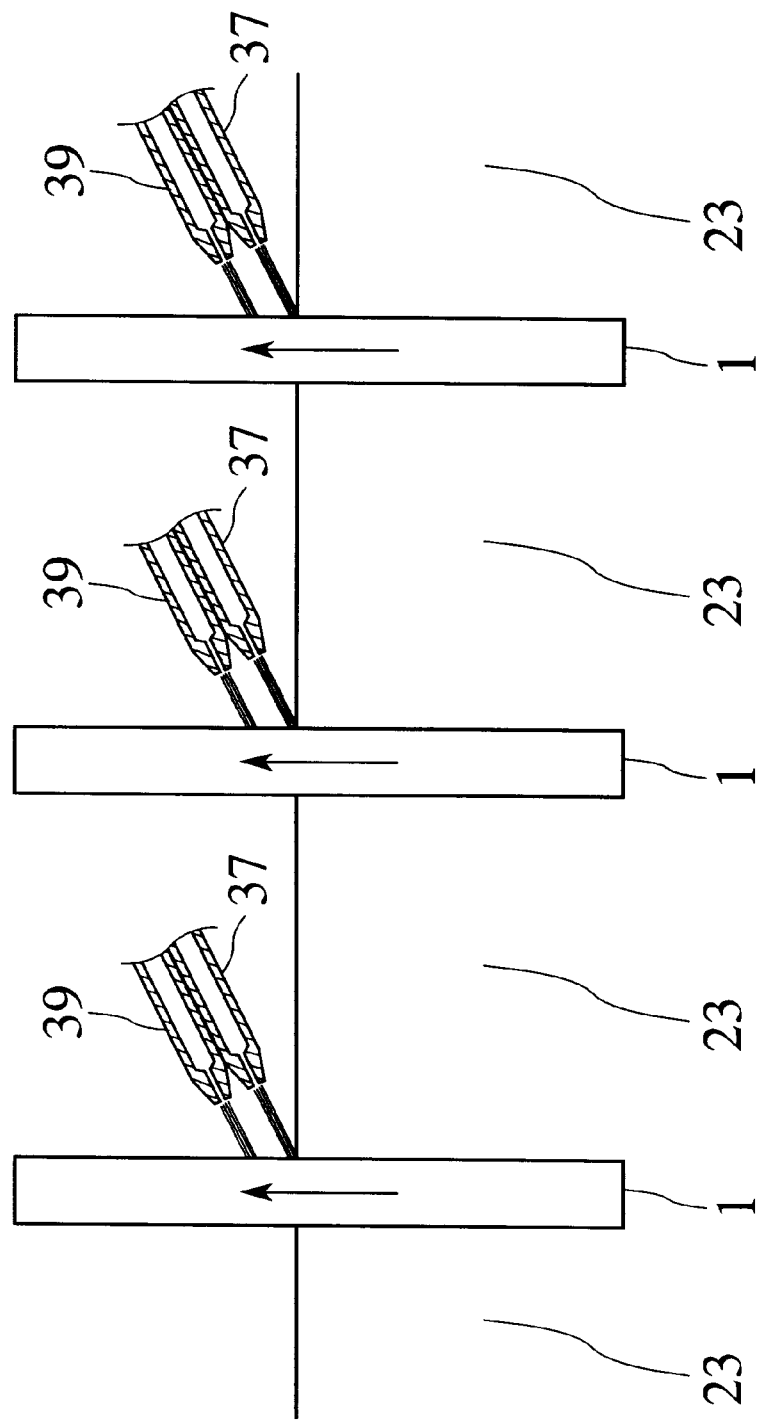
FIG. 8 is a schematic view showing a configuration of a substrate cleaning/drying equipment according to a third embodiment of the present invention.

Next, a third embodiment of the present invention will be explained hereinbelow. FIG. 8 is a schematic view showing a configuration of a substrate cleaning/drying equipment according to the third embodiment of the present invention. The third embodiment of the present invention comprises a steam nozzle 37 for injecting the steam onto the semiconductor substrate 1, and an IPA steam nozzle 39 for injecting the IPA steam onto the semiconductor substrate 1. The steam nozzle 37 and the IPA steam nozzle 39 are connected to a steam supply source and an IPA steam supply source respectively via valves, regulators, etc. As shown in FIG. 8, in the third embodiment, when the semiconductor substrates 1 are pulled up from the ultra pure water 23, the steam 33 being injected from the steam nozzle 37 is placed over the ultra pure water 23 and also the IPA steam 11 being injected from the IPA steam nozzle 39 is placed over the steam being injected from the steam nozzle 37. Therefore, like the first embodiment shown in FIG. 4 and the second embodiment shown in FIG. 7, the semiconductor substrates 1 are passed locally through the ultra pure water 23, the steam 33, and the IPA steam 11 respectively in this order. According to this configuration, generation of the steam 33 and the IPA steam 11 can be controlled easily rather than the first embodiment and the second embodiment, so that margins of conditions for forming the steam 33 and the IPA steam 11 can be set larger. As a result, the steam 33 and the IPA steam 11 can be injected onto the semiconductor substrates 1 stably. Furthermore, only a small amount of the steam 33 and the IPA steam 11 which are employed in cleaning/drying are requested rather than the first embodiment and the second embodiment, whereby consumption of the ultra pure water 23 and the IPA steam 33 can be reduced. As the conditions for generating the steam 33 and the IPA steam 11, a distance between respective nozzles and the surface of the semiconductor substrate 1, a nozzle angle, an injection velocity, etc. may be considered.

Moreover, a concentration of the IPA steam 33 of more than 100 ppm is effective for suppression of the water marks. It is preferable that a concentration of the IPA steam should be set less than 2% with regard to safety and consumption of the IPA steam.

FOURTH EMBODIMENT

Next, a fourth embodiment of the present invention will be explained hereinbelow. The first embodiment shown in FIG. 4, the second embodiment shown in FIG. 7, and the third embodiment shown in FIG. 8 show respectively the batch type substrate cleaning/drying equipment in which a plurality of semiconductor substrates are cleaned/dried at a time, whereas the fourth embodiment of the present invention shows a sheet-fed type substrate cleaning/drying equipment in which a sheet of semiconductor substrate is cleaned/dried at a time. A fifth embodiment described later shows similarly the sheet-fed type substrate cleaning/drying equipment.

In recent years, with the increase in diameter of the semiconductor substrate, it becomes difficult to clean/dry an entire surface of the semiconductor substrate uniformly in the batch type substrate cleaning/drying equipment. There is the case where, if the preceding step or succeeding step is conducted by the sheet-fed type equipment, preferably the cleaning/drying steps should also be conducted by the sheet-fed type equipment. In addition, the case where the cleaning/drying equipment is incorporated into the semiconductor device manufacturing equipment employing multiple chambers may also be thought of. Hence, the sheet-fed type substrate cleaning/drying equipment is now examined. Under such circumstances, the fourth embodiment of the present invention is very significant.

Figure 9:
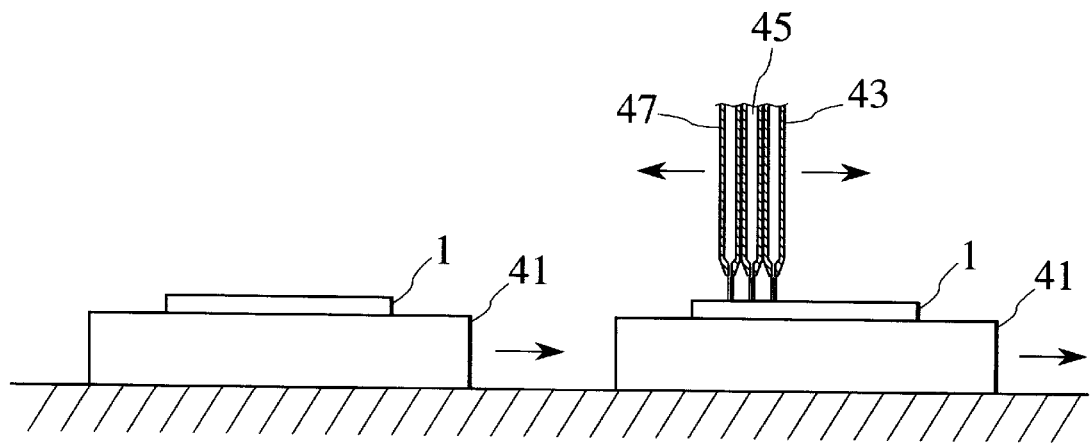
FIG. 9 is a schematic view showing a configuration of a substrate cleaning/drying equipment according to a fourth embodiment of the present invention.
Figure 10:
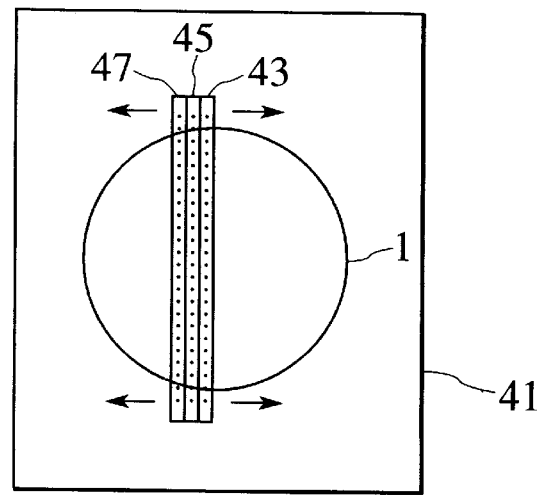
FIG. 10 is a plan view showing the configuration of the substrate cleaning/drying equipment according to the fourth embodiment of the present invention.

FIG. 9 is a side view showing a configuration of the substrate cleaning/drying equipment according to the fourth embodiment of the present invention. FIG. 10 is a plan view showing the configuration of the substrate cleaning/drying equipment in FIG. 9. As shown in FIG. 9, the substrate cleaning/drying equipment according to the fourth embodiment comprises chemicals/ultra pure water nozzles 43 for injecting various chemicals such as hydrogen fluoride and the ultra pure water 23 onto the semiconductor substrates 1, steam nozzles 45 for injecting the steam 33 onto the semiconductor substrates 1, and IPA steam nozzles 47 for injecting the IPA steam 11 onto the semiconductor substrates 1. As shown in FIG. 10, the chemicals/ultra pure water nozzles 43 inject simultaneously various chemicals and the ultra pure water 23 onto preselected areas of the semiconductor substrates 1. The steam nozzles 45 inject simultaneously the steam 33 onto preselected areas of the semiconductor substrates 1. The IPA steam nozzles 47 inject simultaneously the IPA steam 11 onto preselected areas of the semiconductor substrates 1. More particularly, such preselected area is an area which extends from one end to the other end of the semiconductor substrate 1 having a constant width along the longitudinal direction or the lateral direction of the semiconductor substrate 1. The chemicals/ultra pure water nozzles 43, the steam nozzles 45, and the IPA steam nozzles 47 are arranged in parallel with each other. According to this configuration, the semiconductor substrate 1 can be passed locally through the ultra pure water 23, the steam 33, the IPA steam 11 in this order.

An operation of the substrate cleaning/drying equipment according to the fourth embodiment of the present invention will be given as follows. The semiconductor substrates 1 which have been subjected to predetermined semiconductor device manufacturing steps are loaded on respective trays 41 sheet by sheet. The trays 41 on which the semiconductor substrates 1 are loaded are moved under the chemicals/ultra pure water nozzles 43, the steam nozzles 45, and the IPA steam nozzles 47. After such movement, first only the chemicals/ultra pure water nozzles 43 are opened to inject the chemicals and the ultra pure water 23 onto the semiconductor substrates 1 in this order. In injection, the chemicals/ultra pure water nozzles 43 are moved reciprocally relative to the semiconductor substrates 1 repeatedly. Thus, the chemicals process and the ultra pure water cleaning are conducted. Then, after the cleaning has been finished, both the steam nozzles 45 and the IPA steam nozzles 47 are opened. All three nozzles 43, 45, 47 are moved simultaneously in the same direction. As a result, the ultra pure water, the steam, and the IPA steam are supplied onto the semiconductor substrates 1 in this order. That is, drying by using the IPA steam is carried out.

FIFTH EMBODIMENT

Figure 11:
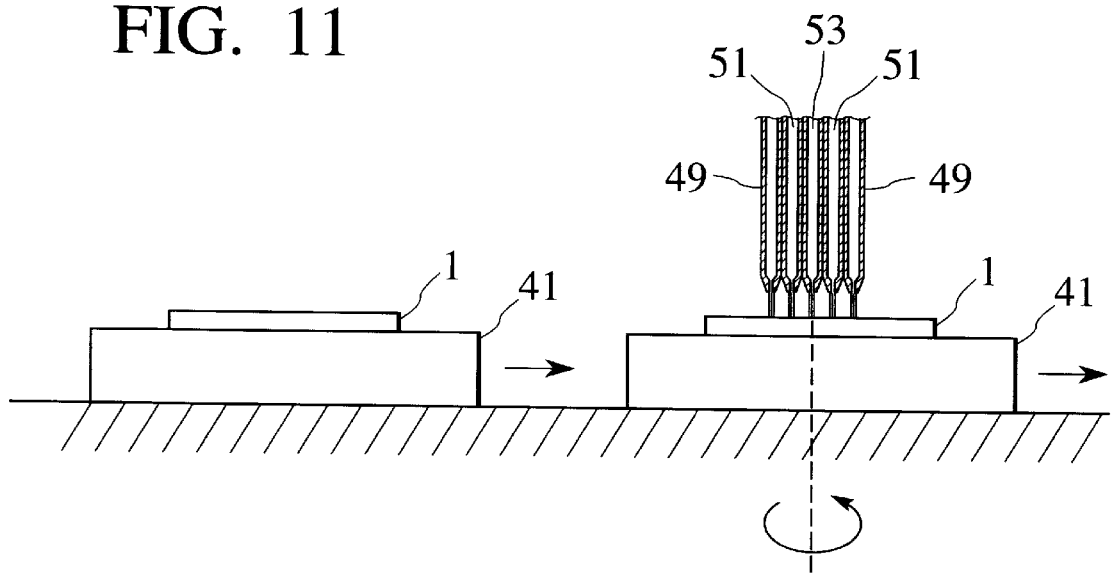
FIG. 11 is a schematic view showing a configuration of a substrate cleaning/drying equipment according to a fifth embodiment of the present invention.
Figure 12:
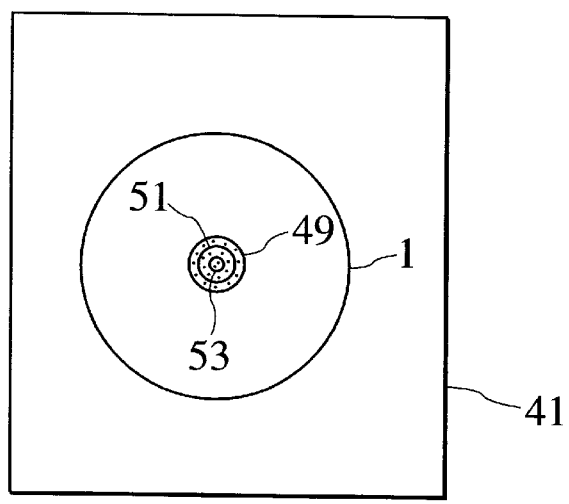
FIG. 12 is a plan view showing the configuration of the substrate cleaning/drying equipment according to the fifth embodiment of the present invention.
Figure 13:
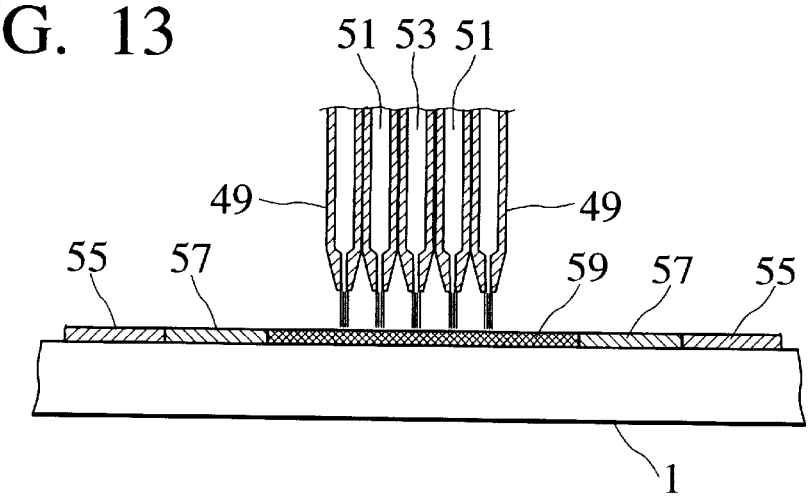
FIG. 13 is a conceptional view showing a state on a semiconductor substrate 1 in FIG. 11.

Next, a fifth embodiment of the present invention will be explained hereinbelow. FIG. 11 is a side view showing a configuration of a substrate cleaning/drying equipment according to a fifth embodiment of the present invention. FIG. 12 is a plan view showing the configuration of the substrate cleaning/drying equipment in FIG. 11. FIG. 13 is a conceptional view showing the state on the semiconductor substrate 1 in FIG. 11. The substrate cleaning/drying equipment according to the fifth embodiment comprises chemicals/ultra pure water nozzles 49 for injecting various chemicals such as hydrogen fluoride and the ultra pure water 23 onto the semiconductor substrates 1, steam nozzles 51 for injecting the steam 33 onto the semiconductor substrates 1, and IPA steam nozzles 53 for injecting the IPA steam 11 onto the semiconductor substrates 1. The chemicals/ultra pure water nozzles 49, the steam nozzles 51, the IPA steam nozzles 53 are arranged in a concentric circle fashion with respect to the semiconductor substrates 1 respectively. The IPA steam nozzles 53, the steam nozzles 51, the chemicals/ultra pure water nozzles 49 are arranged in order from the outside toward the inside of the concentric circle.

An operation of the substrate cleaning/drying equipment according to the fifth embodiment of the present invention will be given as follows. After predetermined semiconductor device manufacturing steps have been completed, the semiconductor substrates 1 are loaded on respective trays 41 sheet by sheet. The trays 41 on which the semiconductor substrates 1 are loaded are moved under the chemicals/ultra pure water nozzles 49, the steam nozzles 51, and the IPA steam nozzles 53. After such movement has been finished, first only the chemicals/ultra pure water nozzles 49 are opened to inject the chemicals and the ultra pure water 23 onto the semiconductor substrates 1 in this order. In this injection, the semiconductor substrates 1 are rotated by a semiconductor substrate rotating mechanism provided to the trays 41. Because of this rotation of the semiconductor substrates 1, the chemicals process and the ultra pure water cleaning are conducted. Then, after the cleaning has been finished, both the steam nozzles 51 and the IPA steam nozzles 53 are opened. After a predetermined period of time has been lapsed, first the chemicals/ultra pure water nozzles 49 are closed and then the steam nozzles 51 and the IPA steam nozzles 53 are closed in sequence. As a result, the ultra pure water 55, the steam 57, and the IPA steam 59 are supplied onto the semiconductor substrates 1 in this order. That is, drying by using the IPA steam is carried out.

OTHER EMBODIMENTS

In the first to fifth embodiments of the present invention, the moisture remaining on the semiconductor substrate after cleaning is replaced with the IPA steam. However, any material may be substituted for the IPA steam if such material has water repellency, volatility being equivalent to the IPA, and a property of reducing a surface tension of the moisture on the semiconductor substrate 1 and further it can be replaced with the moisture on the semiconductor substrate 1. For example, there is a silicone steam as an example.

Various modifications will become possible for those skilled in the art after receiving the teachings of the present disclosure without departing from the scope thereof.

What is claimed is:

1. A substrate cleaning/drying equipment for removing moisture from a cleaned substrate by exposing the substrate to a dry steam, comprising:
   (a) a cleaning/drying chamber for cleaning/drying the substrate;
   (b) a cleaning tub provided below the cleaning/drying chamber, at least a ultra pure water being supplied to the cleaning tub;
   (c) a dry steam supplying means for supplying the dry steam to an upper area of the cleaning/drying chamber;
   (d) a steam supplying means for supplying a steam between the ultra pure water in the cleaning tub and the dry steam; and
   (e) a carrying means for carrying the substrate from the ultra pure water into the dry steam via the steam.

2. A substrate cleaning/drying equipment of claim 1, wherein the steam supplying means is a steam pipe for introducing the steam, which is supplied from a steam supply source provided on an outside of the cleaning/drying chamber, into the cleaning/drying chamber, and
   the dry steam supplying means is a dry steam pipe for introducing the dry steam, which is supplied from a dry steam supply source provided on the outside of the cleaning/drying chamber, into the cleaning/drying chamber.

3. A substrate cleaning/drying equipment of claim 1, wherein the steam supplying means is a steam pipe for introducing the steam, which is supplied from a steam supply source provided on an outside of the cleaning/drying chamber, into the cleaning/drying chamber, and for supplying the steam into the cleaning tub to mate with discharge of the ultra pure water, and
   the dry steam supplying means is a dry steam pipe for introducing the dry steam, which is supplied from a dry steam supply source provided on the outside of the cleaning/drying chamber, into the cleaning/drying chamber.

4. A substrate cleaning/drying equipment of claim 3, wherein the cleaning tub has a means for discharging the ultra pure water.

5. A substrate cleaning/drying equipment of claim 1, wherein the steam supplying means is a steam injection nozzle for introducing the steam, which is supplied from a steam supply source provided on an outside of the cleaning/drying chamber, into the cleaning/drying chamber so as to inject the steam onto the substrate, and
   the dry steam supplying means is a dry steam injection nozzle for introducing the dry steam, which is supplied from a dry steam supply source provided on the outside of the cleaning/drying chamber, into the cleaning/drying chamber so as to inject the dry steam onto the substrate.

6. A substrate cleaning/drying equipment of claim 1, wherein the cleaning tub consists of a single tub, and at least a chemicals and the ultra pure water are supplied to the cleaning tub so as to be replaced perfectly with each other.

7. A substrate cleaning/drying equipment of claim 1, wherein the cleaning tub consists of at least a chemicals tub and a ultra pure water tub which are arranged in parallel.

8. A substrate cleaning/drying equipment for removing moisture from a cleaned substrate by exposing the substrate to a dry steam, comprising:
   (a) a cleaning liquid injecting means for injecting at least a ultra pure water onto the substrate;
   (b) a steam injecting means for injecting a steam onto the substrate;
   (c) a dry steam injecting means for injecting a dry steam onto the substrate; and
   (d) a substrate arranging means for exposing the substrate to the ultra pure water, the steam, and the dry steam in order of the ultra pure water, the steam, and the dry steam.

9. A substrate cleaning/drying equipment of claim 8, wherein the substrate arranging means includes, a substrate carrying means for loading the substrate to move below the cleaning liquid injecting means, the steam injecting means, and the dry steam injecting means, and a moving means for moving the cleaning liquid injecting means, the steam injecting means, and the dry steam injecting means simultaneously over the substrate in a same direction.

10. A substrate cleaning/drying equipment of claim 9, wherein the cleaning liquid injecting means is a cleaning liquid injecting nozzle for injecting the ultra pure water supplied from a ultra pure water supply source onto the substrate, the steam injecting means is a steam injecting nozzle for injecting the steam supplied from a steam supply source onto the substrate, and the dry steam injecting means is a dry steam injecting nozzle for injecting the dry steam supplied from a dry steam supply source onto the substrate.

11. A substrate cleaning/drying equipment of claim 8, wherein the cleaning liquid injecting means, the steam injecting means, and the dry steam injecting means are arranged in a concentric circle fashion such that the cleaning liquid injecting means is arranged on an outside, the steam injecting means is arranged in a middle, and the dry steam injecting means is arranged on an inside, and the substrate arranging means includes, a substrate carrying means for loading the substrate to move below the cleaning liquid injecting means, the steam injecting means, and the dry steam injecting means, and a substrate rotating means for rotating the substrate below the cleaning liquid injecting means, the steam injecting means, and the dry steam injecting means.

12. A substrate cleaning/drying equipment of claim 11, wherein the cleaning liquid injecting means is a cleaning liquid injecting nozzle for injecting the ultra pure water supplied from a ultra pure water supply source onto the substrate, the steam injecting means is a steam injecting nozzle for injecting the steam supplied from a steam supply source onto the substrate, and the dry steam injecting means is a dry steam injecting nozzle for injecting the dry steam supplied from a dry steam supply source onto the substrate.

13. A substrate cleaning/drying method of removing moisture from a cleaned substrate by exposing the substrate to a dry steam, comprising:

(a) a first step of bringing at least a partial region of the substrate into contact with a ultra pure water;

(b) a second step of bringing the partial region of the substrate, which has been contacted with the ultra pure water, into contact with a steam; and (c) a third step of bringing the partial region of the substrate, which has been contacted with the steam, into contact with a dry steam;

wherein the first step, the second step, and the third step are carried out in a same chamber.

\* \* \* \* \*